US005658673A

United States Patent [19]
Holwitt et al.

[11] Patent Number: 5,658,673
[45] Date of Patent: Aug. 19, 1997

[54] MICROWAVE-SENSITIVE ARTICLE

[75] Inventors: Eric A. Holwitt, San Antonio; Johnathan L. Kiel, Universal City; David N. Erwin, San Antonio, all of Tex.

[73] Assignee: The United States of America as represented by the Secretary of the Air Force, Washington, D.C.

[21] Appl. No.: 504,306

[22] Filed: Jul. 20, 1995

[51] Int. Cl.$^6$ .......................... B32B 27/08; B32B 27/34; B32B 27/38; B32B 27/40
[52] U.S. Cl. .................. 428/423.1; 428/413; 428/414; 428/416; 428/417; 428/418; 428/425.1; 428/425.8; 428/425.9; 428/474.4; 428/478.2; 428/478.4; 428/478.8; 428/479.3; 428/479.6; 428/497; 428/498; 524/222
[58] Field of Search ...................... 428/423.1, 413, 428/414, 416, 417, 418, 425.1, 425.8, 425.9, 474.4, 478.2, 478.4, 478.8, 479.3, 479.6, 497, 498; 524/217, 227, 221, 222, 223

[56] References Cited

U.S. PATENT DOCUMENTS

| 4,306,154 | 12/1981 | Williams, Jr. et al. | 250/376 |
| 4,617,195 | 10/1986 | Mental | 427/66 |
| 5,003,050 | 3/1991 | Kiel et al. | 534/573 |
| 5,451,792 | 9/1995 | Maguire et al. | 250/474.1 |

Primary Examiner—W. Robinson H. Clark
Attorney, Agent, or Firm—Charles E. Bricker; Thomas L. Kundert

[57] ABSTRACT

An article which is sensitive to non-ionizing electromagnetic radiation in the radiofrequency radiation range, consisting essentially of a substrate, a layer of a binder material and a layer of activated diazoluminomelanin. This article is prepared by coating at least one surface of a substrate with a binder, immersing the binder-coated substrate into a solution comprising luminol, 3AT and a soluble nitrite for a period of about 2 to 12 days to provide a layer of diazoluminomelanin (DALM) on the binder layer, removing the DALM-coated film from the solution and rinsing the same, activating the DALM with sodium bicarbonate and hydrogen peroxide for a period of about 2 to 12 days.

9 Claims, No Drawings

5,658,673

MICROWAVE-SENSITIVE ARTICLE

RIGHTS OF THE GOVERNMENT

The invention described herein may be manufactured and used by or for the Government of the United States for all governmental purposes without the payment of any royalty.

BACKGROUND OF THE INVENTION

This invention relates to articles sensitive to non-ionizing electromagnetic radiation in the radiofrequency range.

Exposure to microwave power can lead to pathophysiologic effects. In laboratory animals, the microwaves penetrate beneath the skin and heat the tissue. Tissue destruction can result if the temperature rise is faster than the control mechanisms of the body can handle. In the United States, the maximum recommended exposure for humans is 10 $mW/cm^2$ for durations greater than 6 minutes.

Devices designed for detecting and recording exposure to non-ionizing electromagnetic fields are electronic devices that measure magnetic fields, electric fields, or the heat resulting from absorption of such radiation into dielectric materials. The most common detector is a silicon diode designed for high frequencies and mounted in a waveguide or stripline. The diode rectifies the signal and produces an average current that can be indicated by a direct-current meter. Another common detector absorbs microwave power, causing a temperature change and a corresponding change in resistance. Devices for the detection of temperature changes with absorption of radiofrequency (rf) radiation may be photonic rather than electronic, depending on real-time decreases in fluorescence of inorganic crystalline material when heated, together with fiberoptics to transfer the light to an electronic recording device. What is desired is a non-electronic device for detecting and recording exposure to non-ionizing electromagnetic fields.

Accordingly, it is an object of the present invention to provide a non-electronic device for detecting and recording exposure to non-ionizing electromagnetic fields.

It is another object of the invention to provide a method for preparing such a device. Other objects, aspects and advantages of the present invention will be apparent to those skilled in the art from a reading of the following detailed disclosure of the invention.

SUMMARY OF THE INVENTION

In accordance with the present invention there is provided an article which is sensitive to non-ionizing electromagnetic radiation in the radiofrequency radiation range, consisting essentially of a substrate, a layer of a binder material and a layer of activated diazoluminomelanin.

The article of this invention is prepared by coating at least one surface of a substrate with a binder, immersing the binder-coated substrate into a solution comprising luminol, 3AT and a soluble nitrite for a period of about 2 to 12 days to provide a layer of diazoluminomelanin (DALM) on the binder layer, removing the DALM-coated film from the solution and rinsing the same, activating the DALM with sodium bicarbonate and hydrogen peroxide for a period of about 2 to 12 days.

DETAILED DESCRIPTION OF THE INVENTION

The substrate can be any material which is insoluble in water. Suitable substrate materials include glass, paper, fabric, metal, polymer and the like. The substrate surface(s) can be planar or non-planar.

The binder material can be any material which is insoluble in water, binds to the substrate material and to which the DALM can bind or adhere. Suitable binder materials include polyamides, shellac, freshly prepared epoxy polymer, polyurethane coatings, proteins such as albumin, keratin, collagen and gelatin, and the like. Simple experimentation will reveal other suitable binder materials.

Diazoluminomelanin (DALM) and the method for preparing it are described in U.S. Pat. No. 5,003,050, issued Mar. 26, 1991 to Johnathan L. Kiel et al, which is incorporated herein by reference.

The DALM is activated, i.e., made microwave-sensitive, by treating the DALM with a mixture of a peroxide, such as hydrogen peroxide, and a carbonate, such as sodium carbonate or sodium bicarbonate, until the surface becomes fluorescent under long wavelength (300–400 nm) UV light. Exposure of the DALM layer to heat or nonionizing electromagnetic radiation during irradiation with long-wavelength UV light will convert the fluorescent film to a slow fluorescent and phosphorescent film.

The article of this invention can be made susceptible to particular electromagnetic radiation by embedding metal or metallic particles in the substrate or in the binder layer. For example, a substrate film having microscopic magnetite particles embedded therein or a binder having these magnetite particles mixed therein provides an article having increased susceptibility to ferromagnetic heating with changing magnetic fields. Alternatively, fine copper wire of various lengths embedded in the substrate or binder provides an article which is differentially susceptible to various frequencies of electromagnetic radiation. In the latter case, the fine copper wire acts as a quarter- or half-wave antenna, thus allowing for resonance coupling and maximum local heating of the wire(s) and the nearby DALM layer. The pattern of slow fluorescence generated in such an article differentiates environmental heating from that generated by coupling of the radiation. If the wire is embedded as a coil, a changing magnetic field component will be detected as an induced-heating electrical current.

The article of this invention can be evaluated or "read" using a quantitative luminescence imaging system such as the system described in Erwin et al, U.S. Pat. No. 4,948,975, issued Aug. 14, 1990, which is incorporated herein by reference. The slow fluorescence emissions may also be read with a phosphorescent lifetime fluorometer, a camera with low-light intensity film, a low-light intensity video camera, or a pulsed laser scanner, as well as by visual observation.

The article of this invention can be used as a personal radiofrequency radiation dosimeter. This article may be fabricated as a tape or as a part of a piece of equipment which can be placed in or around electronic equipment for detection and recording of electromagnetic interference and cross-talk. An array of such articles may be used to map electromagnetic fields from radar or communication devices.

The following example illustrates the invention:

EXAMPLE

The following stock solutions were prepared: (A) 180 mg luminol per 100 ml dimethyl sulfoxide (DMSO); (B) 270 mg 3-amino-L-tyrosine (3AT) per 100 ml deionized water; and (C) 700 mg sodium nitrite per 100 ml deionized water.

Degreased glass microscope slides were coated on one side with clear epoxy cement (two-component "do it yourself", commercially available epoxy cement), which was allowed to harden. The epoxy-coated slides were then immersed in a DALM-forming solution of 15 ml of luminol in DMSO (solution A), 15 ml of 3AT in water (solution B), and 3 ml of sodium nitrite in water (solution C), for seven days. The slides were removed from the DALM-forming solution, rinsed with deionized water, then activated by placing them in a solution of 8 ml of 0.3M sodium bicarbonate solution and 8 ml of 3% hydrogen peroxide for seven days. The slides were removed from the bicarbonate/peroxide solution, rinsed with deionized water and blotted dry.

The activated slides were tested for green and red fluorescence by exposure to a long-wavelength, hand-held UV light. They fluoresced, but did not visibly slow fluoresce or phosphoresce when the light was turned off. Following heating on a hot plate with concurrent UV exposure or exposure to microwave radiation in a waveguide (20 W incident power at 2450 Mhz for 15 minutes) and cooling in a freezer at −20° C. for a few minutes, the slides showed slow fluorescence when exposed to long-wavelength UV radiation for a few minutes.

Various modifications may be made in the instant invention without departing from the spirit and scope of the appended claims.

We claim:

1. A method for preparing an article sensitive to non-ionizing electromagnetic radiation which comprises:
    a. coating at least one surface of a substrate with a binder;
    b. immersing the binder-coated substrate into a solution comprising luminol, 3-amino-L-tyrosine and a soluble nitrite for a period of about 2 to 12 days to provide layer of diazoluminomelanin thereon;
    c. removing the substrate from the solution and rinsing same;
    d. activating the diazoluminomelanin layer with sodium bicarbonate and hydrogen peroxide for a period of about 2 to 12 days.

2. The method of claim 1 wherein said binder is selected from the group consisting of shellac, freshly prepared epoxy polymer, polyurethane, polyamide and protein.

3. The method of claim 1 wherein said substrate is selected from the group consisting of glass, paper, fabric, metal and polymer.

4. The method of claim 1 wherein said substrate is planar.

5. The method of claim 1 wherein said substrate is non-planar.

6. An article sensitive to non-ionizing electromagnetic radiation in the radiofrequency radiation range consisting essentially of a substrate, a layer of a binder material and a layer of activated diazoluminomelanin. and metal particles embedded in at least one of said substrate or said binder layer.

7. The article of claim 6 wherein said substrate is selected from the group consisting of glass, paper, fabric, metal and polymer.

8. The article of claim 6 wherein said binder is selected from the group consisting of shellac, freshly prepared epoxy polymer, polyurethane, polyamide and protein.

9. The article of claim 6 wherein said substrate is glass and said binder is an epoxy resin.

* * * * *